United States Patent
Melanson et al.

(10) Patent No.: US 7,167,118 B1
(45) Date of Patent: Jan. 23, 2007

(54) CENTERED-PULSE CONSECUTIVE EDGE MODULATION (CEM) METHOD AND APPARATUS

(75) Inventors: John L. Melanson, Austin, TX (US); Melvin L. Hagge, Round Rock, TX (US); Brian David Trotter, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/297,016

(22) Filed: Dec. 8, 2005

(51) Int. Cl.
H03M 3/00 (2006.01)

(52) U.S. Cl. ..................................... 341/143; 341/144

(58) Field of Classification Search ................ 341/143, 341/144
See application file for complete search history.

(56) References Cited

U.S. PATENT DOCUMENTS

| | | | |
|---|---|---|---|
| 5,708,433 A * | 1/1998 | Craven | 341/144 |
| 5,815,102 A | 9/1998 | Melanson | |
| 6,150,969 A | 11/2000 | Melanson | |
| 6,373,334 B1 | 4/2002 | Melanson | |
| 6,489,901 B1 | 12/2002 | Venkitachalam et al. | |
| 6,693,571 B2 | 2/2004 | Melanson et al. | |
| 6,697,004 B1 | 2/2004 | Galton et al. | |
| 6,724,332 B1 | 4/2004 | Melanson | |
| 6,727,832 B1 | 4/2004 | Melanson | |
| 6,738,004 B2 | 5/2004 | Melanson | |
| 6,744,392 B2 | 6/2004 | Melanson | |
| 6,768,779 B1 * | 7/2004 | Nielsen | 375/297 |
| 6,816,100 B1 | 11/2004 | Galton et al. | |
| 6,885,330 B2 | 4/2005 | Trotter et al. | |
| 6,965,335 B1 | 11/2005 | Trotter et al. | |
| 6,967,607 B2 | 11/2005 | Melanson | |
| 7,006,028 B2 | 2/2006 | Galton | |

OTHER PUBLICATIONS

Craven, Toward the 24-bit DAC: Novel Noise-Shaping Topologies Incorporating Correction for the Nonlinearity in a PWM Output Stag, Journal of the AES, May 1993, pp. 291-313, vol. 41, No. 5, Publisher: Audio Engineering Society, Published In: US.
Vankka, et al., A GSM/EDGE/WCDMA Modulator With On-Chip D/A Converter for Base Stations, IEEE Transactions on Circuits and Systems—II: Analog and Digital Signal Processing, Oct. 2002, pp. 645-655, vol. 49, No. 10, Publisher: IEEE , Published In: US.

* cited by examiner

*Primary Examiner*—Rexford Barnie
*Assistant Examiner*—Joseph Lauture
(74) *Attorney, Agent, or Firm*—Andrew M. Harris; Mitch Harris, Atty at Law, LLC (57) ABSTRACT

A centered-pulse consecutive edge modulation (CEM) method and apparatus provides a pulse output that advantageously exploits the full edge update rate of the CEM while providing substantially centered pulses. The method and apparatus also operate without substantial delay in the input control path. The apparatus includes a delta-sigma noise shaping modulator followed by a CEM that receives an output of the delta-sigma modulator quantizer. A non-linear correction signal is applied with polarity alternating at each edge and is applied to the quantizer input or is designed into the quantizer transfer function. The non-linear correction signal compensates for the noise-shaping modulator output such that the expected rising edge and falling edge widths of the CEM output pulses are substantially equal with respect to a DC input to the delta-sigma modulator.

20 Claims, 7 Drawing Sheets

CENTERED-PULSE CONSECUTIVE EDGE MODULATION (CEM) METHOD AND APPARATUS

BACKGROUND OF THE INVENTION

1. Field of the Invention

The present invention relates generally to pulse modulators, and more specifically, to a consecutive edge modulator having centered pulses and noise shaping.

2. Background of the Invention

Consecutive edge modulators (CEMs) are desirable in applications such as digital-to-analog (D/A) converters and power output circuits due to the effectively doubled control update rate per pulse. Since the pulse output is controlled with respect to both the leading edge and the trailing edge, the control function is more responsive, leading to a lower operating frequency for a given required response.

In particular, in applications requiring a highly stable and accurate output, the CEM output circuit is driven by a noise-shaping modulator that pushes the conversion "noise" due to the discrete nature of the CEMs transfer function to the high end of the frequency spectrum, where the output filters can effectively remove the noise. In such applications, the nature of the alternating control function of the CEM requires inversion of the CEM control input signal provided by the output of the noise shaping modulator. However, the alternating control function also causes the noise-shaping correction to break down, as the shaping correction causes large changes in edge position between adjacent pulses.

U.S. Pat. No. 5,708,433 describes a CEM methodology that applies a non-linear correction function of alternating polarity to the noise-shaping modulator and also mentions another prior technique of applying separate noise shaping to the positive and negative edge controls (interleaved noise-shaping). The technique disclosed in U.S. Pat. No. 5,708,433 represents an improvement over interleaved noise-shaping in that the higher effective oversampling rate of the CEM is also advantageously applied to the noise shaping. The above-mentioned technique observes the output history of the CEM pulse modulator, applies a non-linear correction with alternating polarity and effectively introduces the correction to the input by combining the corrections with the input signal in the noise-shaping modulator.

However, the above-mentioned technique also introduces an artifact: the response to a DC level at the noise-shaper input has a component at the quantizer output that causes the rising edge and falling edge portion of the CEM output pulses to differ in expected value. The difference between the pulse portions skews the available dynamic range, thus shortening it. Further, positive feedback causes the edge positions to "creep" forward in time. The above-described CEM also of necessity includes delays in the forward signal path due to the pulse history required to provide the look-ahead operation.

Therefore, it would be desirable to provide a CEM method and apparatus that includes noise-shaping applied at the full output edge rate with substantially centered pulses and no movement of the pulses in time. It would further be desirable to provide such a CEM apparatus that does not require storage of a history of the pulse output and does not have substantial delay in the forward signal path.

SUMMARY OF THE INVENTION

The above stated objectives are achieved in a method and apparatus for noise-shaping in a consecutive edge modulator (CEM). The method is a method of operation of the apparatus.

The apparatus includes a delta-sigma noise-shaping modulator providing input to a CEM and a non-linear element for altering a transfer function from the input of the delta-sigma modulator to the input of the CEM. The non-linear element introduces a noise-shaping correction signal such that said CEM generates pulses having a substantially equal expected rising edge and falling edge widths for DC values input to the noise-shaping modulator.

The non-linear element may be a block that receives the input to the noise-shaping modulator and generates a control signal according to a non-linear function that is then inverted for alternate cycles in conformity with a clock cycle at half the CEM output pulse rate. Alternatively, the non-linear element and inversion operation may be located in-line with the input to the quantizer or may be a non-linear correction coupled in parallel with the connection from the output of the integrator chain to the quantizer. The in-line version of the non-linear element may be implemented in the quantizer itself, with the quantizer receiving the half CEM pulse rate clock to control the inversion of the transfer function. In addition to inversion, the non-linear element response shape may also differ from odd to even pulse cycles in order to further tailor the response.

The foregoing and other objectives, features, and advantages of the invention will be apparent from the following, more particular description of the preferred embodiment of the invention, as illustrated in the accompanying drawings.

DESCRIPTION OF ILLUSTRATIVE EMBODIMENT

The present invention encompasses a method and apparatus for producing a noise-shaped consecutive edge modulated (CEM) signal having expected rising and falling edge portions that are substantially equal for DC inputs to the noise-shaper. Thus, the present invention provides a noise-shaped CEM signal with noise-shaping across the full set of pulses (as opposed to interleaved noise-shaping) without the residual width differences present in prior noise-shaped CEMs and without the edge "creep" present in such modulators.

The method and apparatus provide a CEM modulation control signal from the output of the quantizer of a noise-shaping modulator. The quantizer input is combined with a non-linear signal having a polarity that alternates at each output of the quantizer (i.e., at each pulse portion of the CEM pulse output signal). The non-linear element may receive the input signal of the noise-shaping modulator or may receive the output of the noise-shaping filter chain. The non-linear element and inversion may be incorporated within the quantizer response, with the quantizer receiving a clock signal that alternates each sample period. The result of the introduction of the non-linearity into the quantizer is an equalization of the quantizer output so that an output having substantially equal rising edge and falling edge portion widths is produced with respect to a DC level at the input to the noise-shaping modulator.

Figure 1:
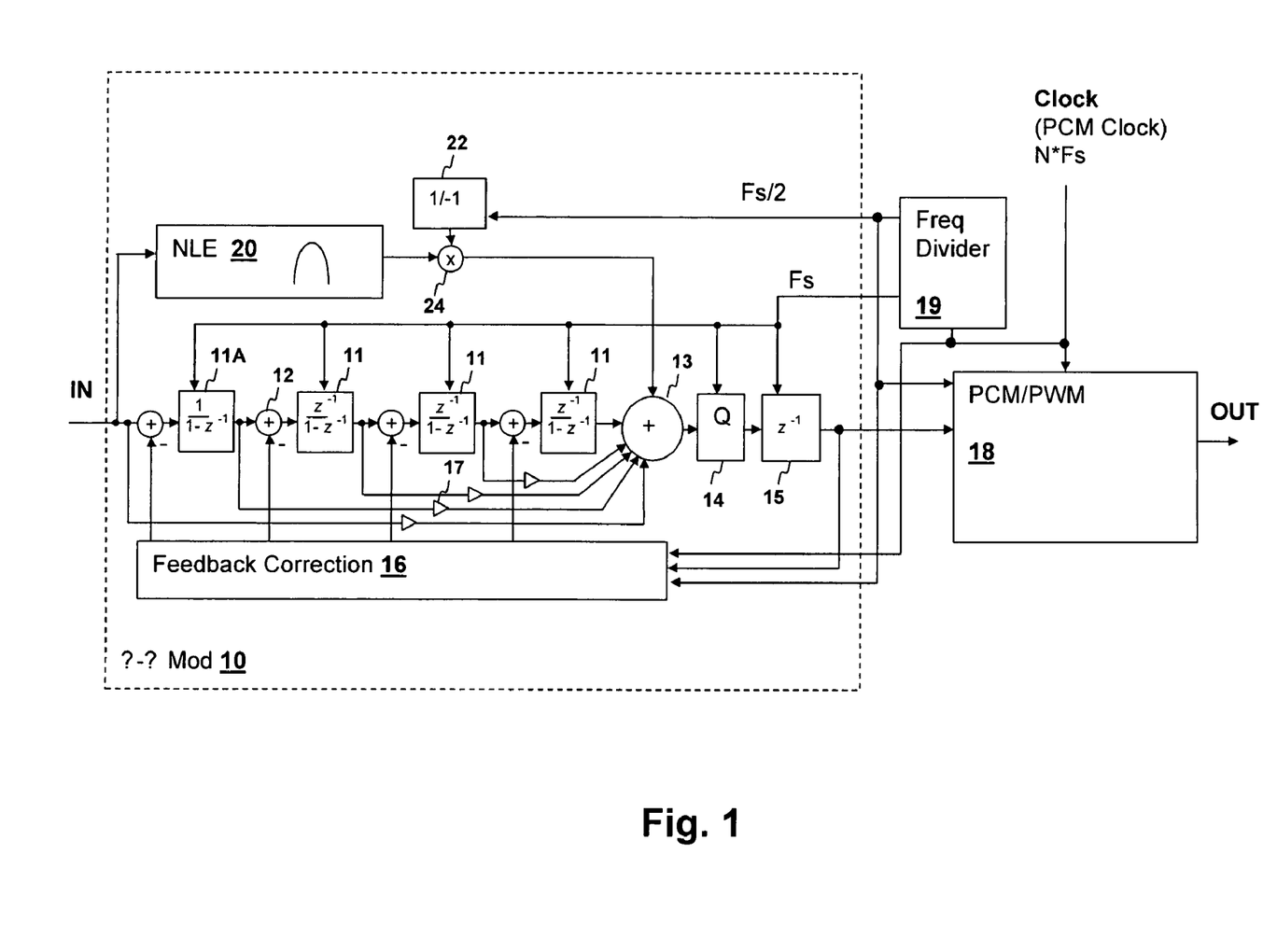
FIG. 1 is a block diagram depicting an apparatus in accordance with an embodiment of the present invention.

Referring now to FIG. 1, a circuit in accordance with an embodiment of the present invention is shown. A noise shaping delta-sigma modulator 10 has an input IN for receiving a pulse generator input signal and provides a noise-shaped output that is supplied to a pulse generator implemented by a pulse width modulator (PWM)/pulse code modulator (PCM) 18. PCM/PWM 18 oversamples the output of delta-sigma modulator 10 by a factor of N, and is clocked by a PWM Clock signal at frequency N*Fs. The Clock signal is also divided by a frequency divider 19 that produces the sample clock Fs and its division by two: Fs/2. The sample clock controls the clock timing of internal integrators 11A, 11 and delays 15 of delta-sigma modulator 10 as well as the quantizer 14. Thus, the sample rate into and out of delta-sigma modulator is at frequency Fs, while the PWM resolution or PCM cell rate is at frequency Fs*N, while the PWM pulse output rate (or PCM code rate) is at frequency Fs. The structure of the filter preceding quantizer 14 is only exemplary, and delay 15 will not be present if the non-delaying integrator 11A is replaced by a delaying integrator 11.

Quantizer 14 has a number of output levels sufficient to support the oversampling rate N, so that at each output sample of quantizer 14, a pulse width of 0 to N clocks is produced. PCM/PWM 18 implements a CEM, and is provided with the Fs/2 clock signal to toggle between generating positive and negative pulse portions. The duration of the high-state width of each of the pulse portions is determined by the quantizer sample for that portion so that in the exemplary embodiment, for even samples out of quantizer 14, PCM/PWM generates a positive pulse portion having a width equal to the quantizer output number of Clock signal periods when measured as extending from the middle of the pulse back to the rising edge of the pulse. For odd samples out of quantizer 14, PCM/PWM generates a positive pulse portion having a width equal to the next quantizer output number of Clock signal periods measured from the middle of the pulse to the falling edge of the pulse.

The response of quantizer 14 and PCM/PWM 18 is such that for increasingly positive samples at the output of quantizer 14, PCM/PWM 18 generates increasingly early rising edges and increasingly delayed falling edges, depending on the particular pulse portion that is generated for the given quantizer sample. For rising edge portions (REP) of a pulse (odd samples of the output of quantizer 14), a highest count from quantizer 14 causes a minimum delay of the rising edge. For falling edge portions (FEP) of the pulse (even samples of the output of quantizer 14), a highest count from quantizer 14 causes a maximum delay of the falling edge. The lowest (or most negative) count from quantizer 14 yields an earliest falling edge in the FEP or a latest rising edge in the REP. PCM/PWM 18 can be implemented by a counter that is loaded with the quantizer sample, clocked by the Clock signal and the output of PCM/PWM 18 taken from a decode of the counter outputs.

Delta-sigma modulator 10 implements a noise shaper using a series of integrator stages 11 that receive the input signal from the previous stage and a first integrator stage 11A that receives the pulse generator input signal. The inputs of integrators 11, 11A also receive a set of correction terms from a feedback correction block 16. Feedback correction block 16 receives the output of delta-sigma modulator 10 and generates appropriate correction terms for each stage. The correction terms are alternated at each cycle of the sample clock in response to the Fs/2 clock signal. Scaling blocks 17 are provided to scale the outputs of integrators 11, 11A for final summation by a combiner 13, but depending on the design of the delta-sigma modulator 10, scaling blocks 17 may not be needed in a particular design (if each term is unity) or the connections from each integrator output to combiner 13 will be absent completely for a feedback-only filter design. Quantizer 14 receives the combined output of the terms from each integrator 11 and the input signal IN and also a non-linear correction signal provided by a non-linear element 20 that receives signal IN and generates a value in non-linear functional dependence on the value of IN. While the term "signal" is used freely herein to describe various inputs and outputs connected between blocks and received and sent between the circuits described herein and external devices, the values are generally parallel digital numeric values that may be fixed or floating-point values. However, the concepts described and claimed herein have applicability to mixed-signal approaches, and should be understood to include analog signals with appropriate conversions when connected with digital blocks.

Non-linear element 20 has an output that is provided to combiner 13 via a multiplier 24 that negates the numerical value of the output of non-linear element 20 for odd cycles in response to the Fs/2 clock signal by multiplying by a factor provided by sign change block 22 selected by the Fs/2 clock signal. The result is that the non-linear correction signal applied to combiner 13 alternates in polarity between positive and negative pulse portions, and with the proper non-linear function implemented by non-linear element 20, shapes the noise of the output delta-sigma modulator 10 without generating substantial Nyquist artifacts that would otherwise cause the expected pulse portion widths for a DC input to change from cycle to cycle.

Without non-linear element 20 and associated components 22,24, the CEM will function, but will exhibit similar behavior as the "history" type modulator described in the above-referenced U.S. Pat. No. 5,708,433. The effect of the non-linear element 20 compensation signal is to remove the Nyquist rate alternation that otherwise causes the width of the rising and falling edge portions of the pulses to be asymmetric with respect to the edge of the sampling clock. The compensation results in an output from PCM/PWM 18 in which the expected widths of the positive portions to be substantially equal, and therefore the expected widths of negative portions are also substantially equal. While the expected widths of the pulse portions will change with a change in the DC value input to delta-sigma modulator 10, the portion widths themselves will be held substantially equal for an operating range of DC input values. The DC operating range is determined by the modulation range of the noise shaping modulator among other factors. The result of the pulse width equalization is that additional dynamic (AC signal) range can be provided by the circuit, as the variation in pulse widths otherwise present consumes a portion of the dynamic range. Further, the equalization of the pulse portion widths removes the movement of the pulse centers with respect to the sampling clock that will otherwise occur due to feedback around the delta-sigma modulator 10.

While feedback compensation block 16 is also a non-linear element, and while the above-referenced U.S. Pat. No. 5,708,433 describes compensation by a set of non-linear look-up tables, those non-linear elements are for linearizing the noise-shaper and the non-linear element and are introduced in the feedback path of the filter portion of the modulator. The additional non-linear element introduced by the present invention additionally corrects for the variation in expected value of the pulse portions output from the modulator. The non-linear function can be made to differ arbitrarily between positive and negative pulse portions, but simulations have shown that a substantial reduction in residual DC-input artifacts is accomplished by an alternating polarity signal that approximates the square of the input signal IN or alternatively the square of the signal from the combiner that combines the output of the integrator chain that would otherwise provide the sole input to the quantizer.

The use of the terms "non-linear" and "non-linear element" within this specification, especially as applied to the non-linear nature of non-linear element 20, is an indication of a correspondence between input and output that does not follow (sample) a line. In general, the non-linear response function of non-linear element 20 will sample a function having an order higher than unity (such as the square law mentioned above) and does not indicate the "non-linearity" that is present in all discrete systems that must of necessity implement a quantization of an otherwise continuous-valued ideal signal.

Figure 2:
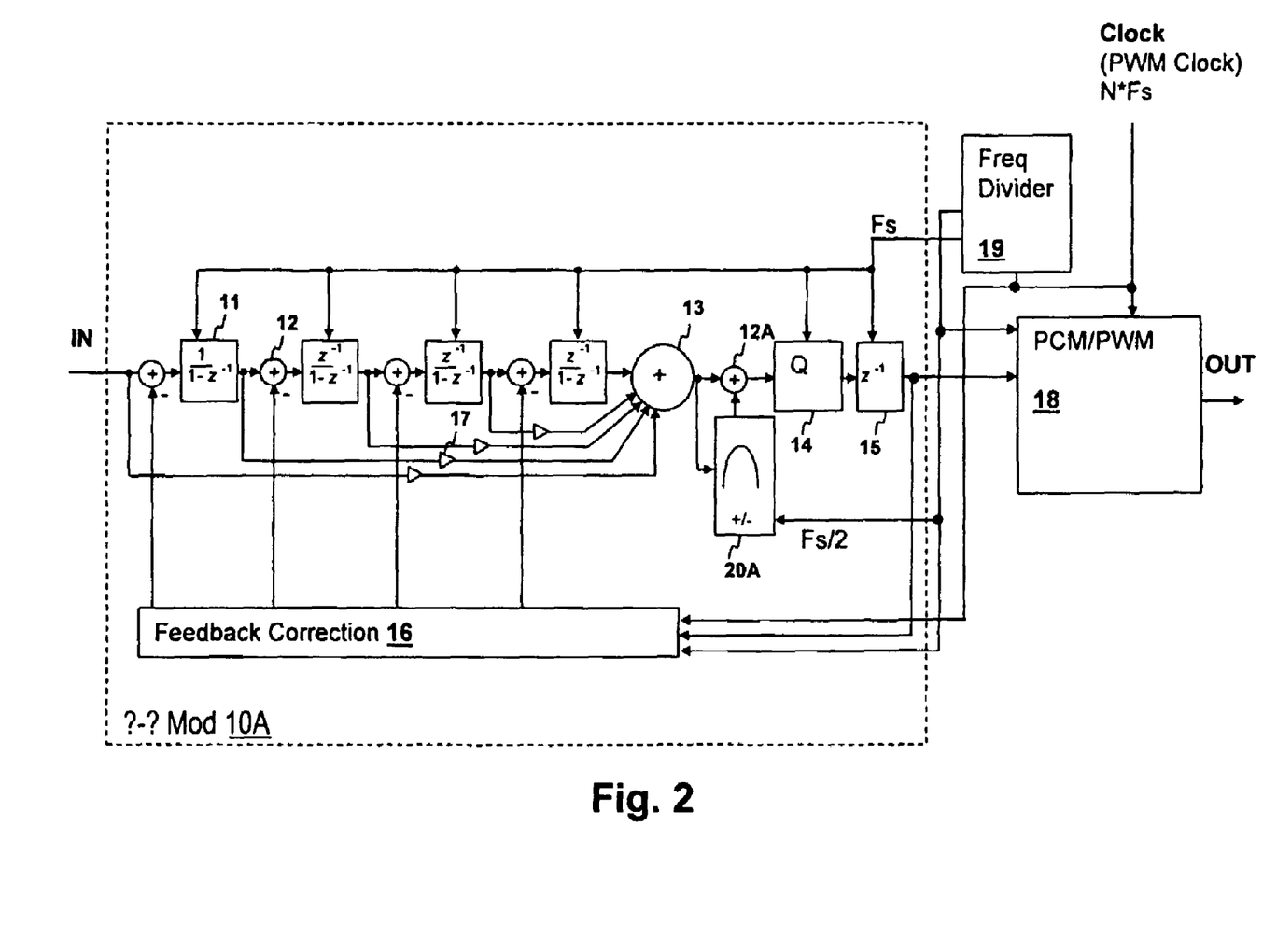
FIG. 2 is a block diagram depicting an apparatus in accordance with another embodiment of the present invention.

Referring now to FIG. 2, a pulse generating circuit in accordance with another embodiment of the present invention is shown. The circuit depicted is similar to that of FIG. 1, and therefore only differences between the circuits will be described below. The circuit of FIG. 2 incorporates a non-linear element 20A in-line with the input to quantizer 14. Non-linear element 20A receives the Fs/2 clock signal and alternates the polarity of its output in response to the state of the Fs/2 clock signal signal. The depicted circuit includes a direct path to quantizer 14 through combiner 12A and a non-linear path through non-linear element 20A, but it will be understood that the construction of non-linear element 20A can be such that only the non-linear path is present: i.e., combiner 12A can be removed and non-linear element 20A inserted directly in the path between the output of combiner 13 and the input of quantizer 14 if non-linear element 20A implements a function that has both the normal linear response combined with a non-linear correction.

Figure 3:
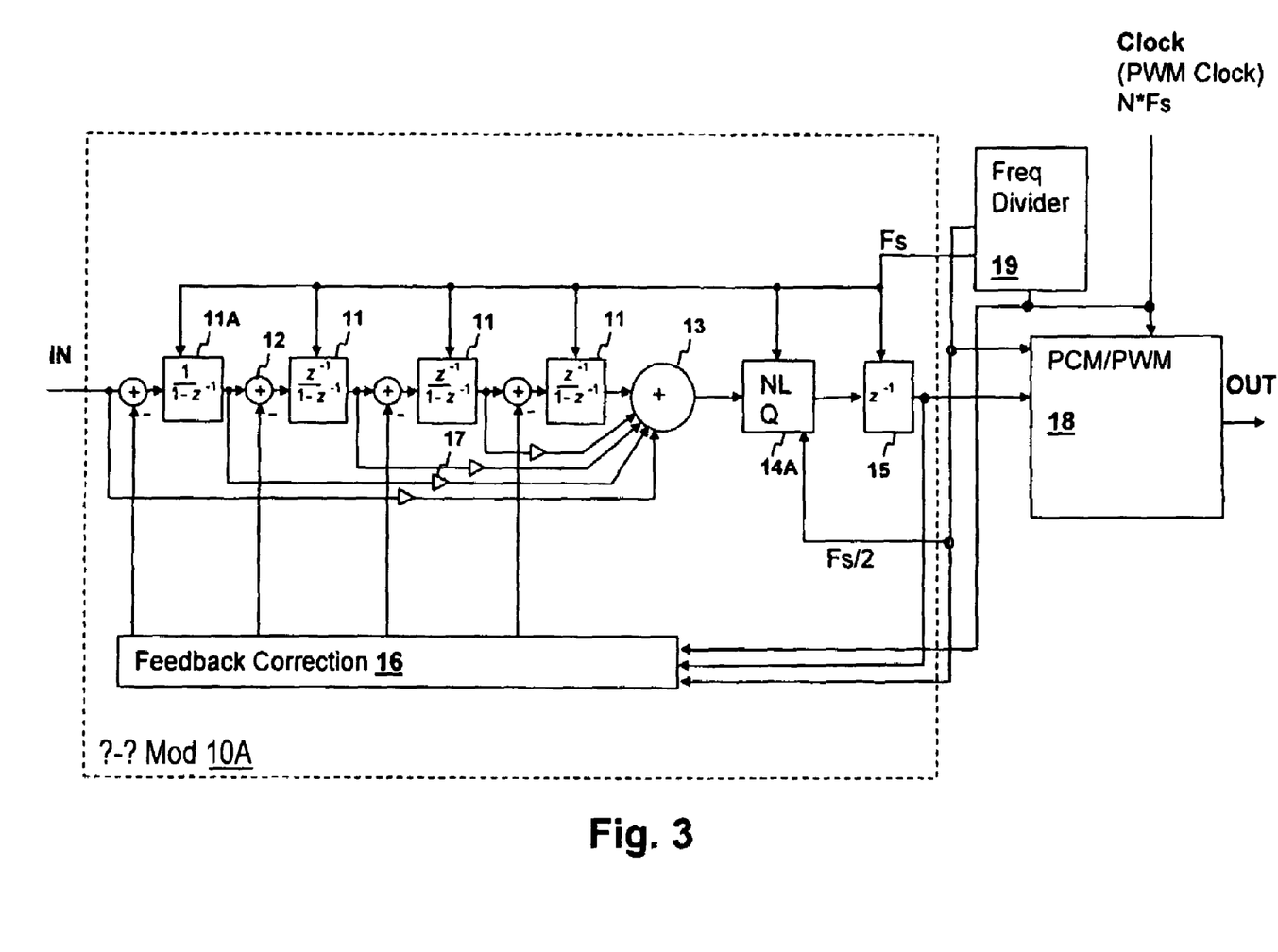
FIG. 3 is a block diagram depicting an apparatus in accordance with yet another embodiment of the present invention.

Referring now to FIG. 3, a pulse generating circuit in accordance with another embodiment of the present invention is shown. The circuit depicted is similar to that of FIGS. 1 and 2, and therefore only differences between the circuits will be described below. The circuit of FIG. 3 incorporates a "non-linear" quantizer 14A in which the quantization response is computed according to the required non-linear correction. Non-linear quantizer 14A receives the Fs/2 clock signal and alternates the polarity of the applied non-linear correction in response to the state of the Fs/2 clock signal. Since a standard quantizer is by its very nature "non-linear" in the strict mathematical sense, it must be understood that the non-linearity of quantizer 14A (or alternatively in its quantization response) is a deviation from a response that samples a line, i.e., a response having a monotonically increasing or decreasing step size with respect to a constant input step size. In the present invention, as mentioned above, the step size will generally increase in magnitude with increasing input magnitudes, as the desired function is of an order higher than unity and can be approximated by a square-law function added to a linear function.

Figure 4:
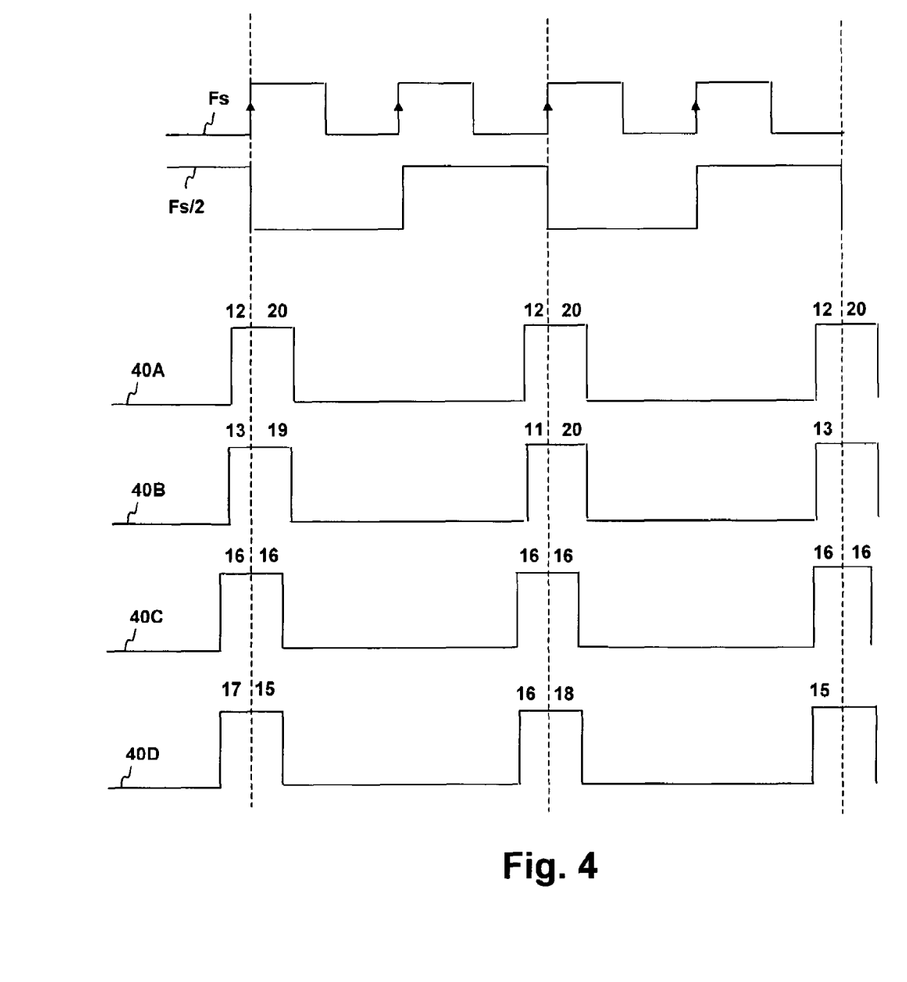
FIG. 4 is a timing diagram showing an output of an apparatus in accordance with embodiments of the present invention in comparison with prior art results.

Referring now to FIG. 4, a timing diagram is provided to illustrate the differences between operation of embodiments of the above-referenced U.S. Pat. No. 5,708,433 and the present invention. Clock signals Fs and Fs/2 are shown for reference. Pulse generator output signal traces 40A and 40B correspond to an output of the prior art circuit disclosed in the above-referenced U.S. Pat. No. 5,708,433 and also the circuits disclosed in FIGS. 1–3 if the non-linear correction elements are removed. Pulse generator output signal traces 40C and 40D correspond to an output of the circuits depicted in FIGS. 1–3. All of signal traces 40A–40D illustrates operation with an exemplary DC input that commands a 25 percent positive duty cycle output. For the prior art case, output signal 40A has an average positive value over each interval of 32/128, which is 25 percent, but the expected width of each consecutive positive pulse portion differs. Signal trace 40B illustrates the behavior of a prior art pulse generator (without correction) with the effects of the noise-shaping of delta-sigma modulator 10 taken into account.

For embodiments of the present invention, output signal trace 40C has equal rising and falling edge pulse portion widths of 16. The difference is due to an in-band Nyquist artifact present at the output of the noise-shaper in the prior art circuits, but is not generated in the embodiments of the present invention due to the application of the non-linear correction signal at the quantizer, rather than in the feedback from a pulse history. Output signal trace 40D illustrates operation of circuits in accordance with embodiments of the present invention with the effects of the noise-shaping of delta-sigma modulator 10 taken into account. The pulse portions vary and differ due to instantaneous commanded variations in the noise shaping, but the expected value is still equal for the rising edge and falling edge pulse portions.

Figure 5A:
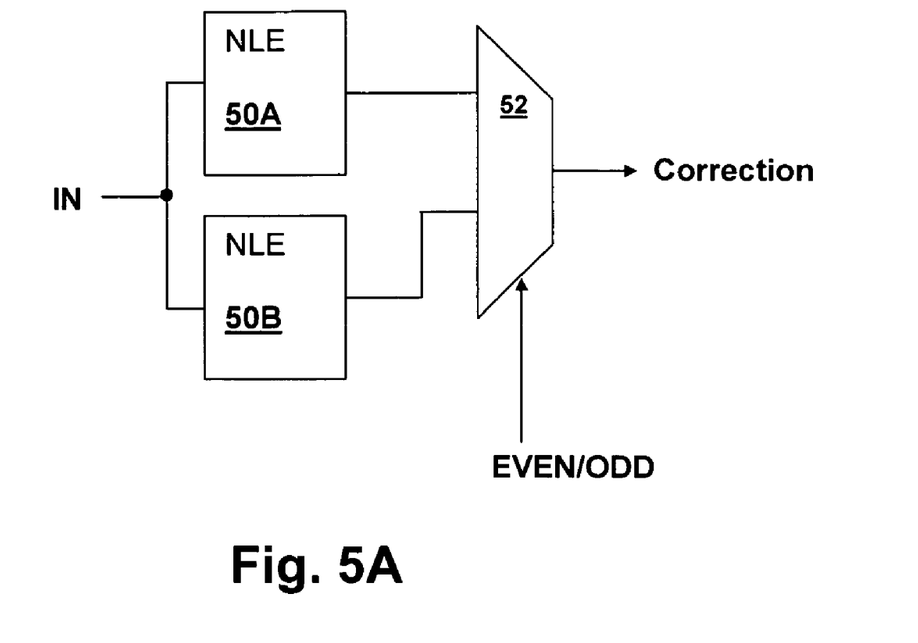
FIGS. 5A and 5B are block diagrams depicting alternative embodiments of non-linear elements as may be used in an apparatus in accordance with an embodiment of the present invention.
Figure 5B:
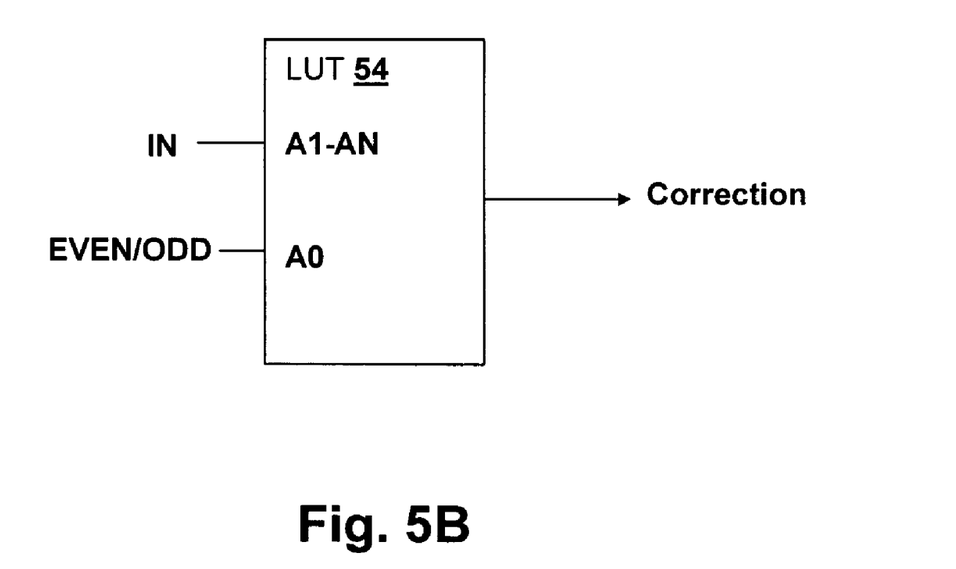

Referring now to FIGS. 5A and 5B, alternative implementations of non-linear elements as may be incorporated in embodiments of the present invention are shown. The non-linear element depicted in FIG. 5A includes two non-linear elements 50A and 50B each associated with a corresponding pulse portion polarity (rising or falling). A selector 52 is controlled by the Fs/2 clock signal to select the appropriate non-linear function. The depicted embodiment can provide two completely independent non-linear functions for implementing the non-linearity for each pulse portion (as opposed to the sign-change implementation included in FIG. 1) and can replace non-linear element 20, multiplier 24 and sign-change block 22 of FIG. 1 and can implement non-linear element 20A of FIG. 2. A similar architecture can be implemented for quantizer 14A of FIG. 3 by selecting between two separate quantizers.

The circuit of FIG. 5B depicts a look-up table implementation, in which the input signal to the non-linear element (or non-linear quantizer) is selected by address bits A1–AN and the Fs/2 clock supplies the EVEN/ODD signal to address bit A0 supplied to look-up table (LUT) 54, for selecting between locations corresponding to even/odd quantization functions.

Figure 6A:
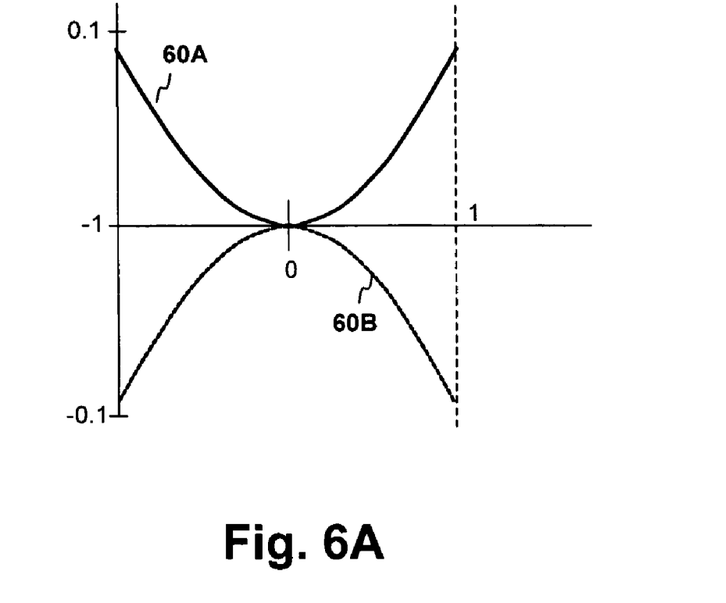
FIGS. 6A–B and 7A–B are graphs depicting responses of non-linear elements as employed in embodiments of the present invention.
Figure 6B:
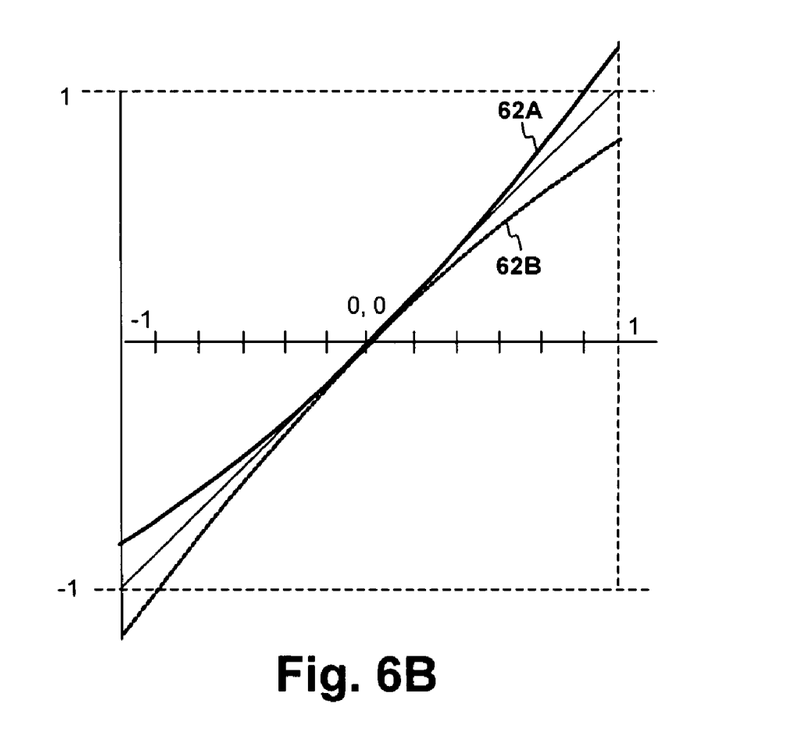

Referring now to FIGS. 6A and 6B, behavior of non-linear elements as employed in the various embodiments of the present invention is depicted. The response of a non-linear element such as non-linear element 20 of FIG. 1 and non-linear element 20A of FIG. 2 is depicted in FIG. 6A. The response is dependent on the particular noise-shaping non-linear feedback correction terms applied to the loop filter, which determines the error that is then corrected by the additional non-linear element of the present invention. Depending on the feedback correction applied, the maximum deviation from an ideal transfer function without the non-linear element of the present invention may be at the midpoint of the quantizer range or at the ends.

The response illustrated by FIG. 6A is of a form that corrects for maximum deviation from ideal at the ends of the quantizer range and has two polarities 60A and 60B that are selected between according to the Fs/2 clock signal and have parabolic shapes that can be approximated by:

$$Out=+/-0.08*In^2$$

FIG. 6B shows the response of a combined linear/non-linear element such as quantizer 14A of FIG. 3. The response again has two polarities 62A and 62B that correspond to the polarities 60A and 60B of the pure non-linear element described by FIG. 6A, which can be approximated by:

$$Out=In +/-0.08*In^2$$

The combined response illustrated by graphs 62A and 62B represents addition of the non-linear correction factor to a response that otherwise does not alter the quantizer input signal. However, the above approximation is not an exact ideal correction factor and modeling of a particular noise-shaper/modulator combination can be used to yield a particular correction factor to equalize the expected pulse widths for that combination.

Figure 7A:
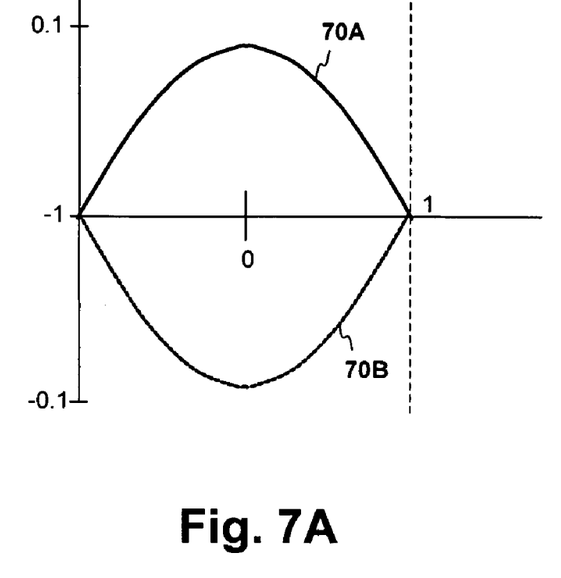
Figure 7B:
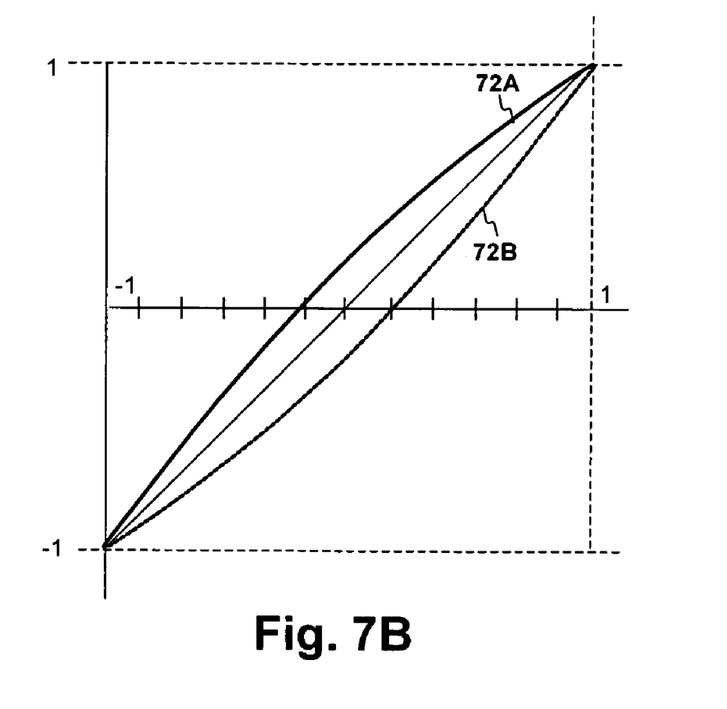

Referring now to FIGS. 7A and 7B, behavior of other non-linear elements as employed in the various embodiments of the present invention is depicted in which the feedback correction terms exhibit a maximum error at the midpoint of the quantizer range. The response of a non-linear element such as non-linear element 20 of FIG. 1 and non-linear element 20A of FIG. 2 is depicted in FIG. 7A. The response has two polarities 70A and 70B that are selected between according to the Fs/2 clock signal and have parabolic shapes that can be approximated by:

$$Out=+/-0.08*[(In-1)(In +1)]$$

FIG. 7B shows the response of a combined linear/non-linear element such as quantizer 14A of FIG. 3. The response again has two polarities 72A and 72B that correspond to the polarities 70A and 70B of the pure non-linear element described by FIG. 7A, which can be approximated by:

$$Out=In +/-0.08*[(In-1)(In +1)]$$

The combined response illustrated by graphs 72A and 72B represents addition of the non-linear correction factor to a response that otherwise does not alter the quantizer input signal. As in the non-linear correction illustrated in FIGS. 6A and 6B, the above approximation is not an exact ideal correction factor and modeling of a particular noise-shaper/modulator combination can be used to yield a particular correction factor to equalize the expected pulse widths for that combination.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A pulse generating circuit, comprising:
a delta-sigma modulator having an input for receiving a pulse generator input signal;
a quantizer having an input for receiving an output of said delta-sigma modulator;
a pulse generator including a consecutive-edge modulator for modulating both a rising edge and a falling edge of pulses generated at an output of said pulse generator, said pulse generator having an input coupled to an output of said quantizer; and
a non-linear element for altering a transfer function from said input of said delta-sigma modulator to said output of said quantizer such that said pulse generator generates said pulses so that expected values of pulse widths of a predetermined state are substantially equal for both rising edge and falling edge portions of said pulses for DC values applied to said input of said delta-sigma modulator within an operating range of DC values.

2. The pulse generating circuit of claim 1, wherein said non-linear element performs a non-linear operation that alternates between two different functions, and wherein said alternation occurs at each sample output of said quantizer.

3. The pulse generating circuit of claim 2, wherein said two different functions are a first function and a negation of said first function.

4. The pulse generating circuit of claim 2, wherein the absolute value of said function during even pulses differs from the function for odd pulses.

5. The pulse generating circuit of claim 2, wherein said function approximates a square of an input to said non-linear element.

6. The pulse generating circuit of claim 1, wherein said non-linear element is implemented within said quantizer, and wherein said quantizer has an increasing output step magnitude with respect to increasing input magnitude values.

7. The pulse generating circuit of claim 1, wherein said quantizer has a control input for receiving a control signal that alternates with each sample output from said quantizer, and wherein a response of said quantizer is altered in response to said control input.

8. The pulse generating circuit of claim 7, wherein said response has a first component approximating a linear function and a second component approximating a higher-order polynomial, wherein said second component is changed in polarity of application to said response in conformity with said control signal.

9. The pulse generating circuit of claim 1, wherein said non-linear element has an input for receiving said pulse generator input signal and wherein said pulse generating circuit further comprises a combiner for combining an output of said non-linear element with said output of a loop filter of said delta-sigma modulator to produce a combined quantizer input signal, and wherein said pulse generator receives said combined quantizer signal and modulates said rising and falling edges of said pulses in conformity therewith.

10. The pulse generating circuit of claim 9, further comprising a sign-changing element having a first input coupled to said output of said non-linear element, an output coupled to said input of said quantizer and a second input that controls a polarity of an output of said sign-changing element, wherein said second input is connected to a control signal that alternates with each sample output from said quantizer.

11. The pulse generating circuit of claim 9, wherein said non-linear element comprises:
   a first non-linear element;
   a second non-linear element; and
   a multiplexer for selecting between an output of said first non-linear element and said second non-linear element in response to a control signal that alternates with each sample output from said quantizer.

12. A method of generating a consecutive-edge modulated signal, comprising:
   noise-shaping a control input signal of a consecutive-edge modulator from a noise-shaper input signal provided for controlling an output of said consecutive-edge modulator;
   quantizing a result of said noise-shaping;
   generating pulses having trailing edges and leading edges controlled in conformity with a result of said quantizing; and
   introducing a non-linearity to said quantizing wherein said non-linearity causes expected values of pulse widths of a predetermined state to be substantially equal for both rising edge and falling edge portions of said pulses for DC values applied to said input of said delta-sigma modulator within an operating range of DC values.

13. The method of claim 12, wherein said introducing a non-linearity introduces a non-linear value modeled on a value of said noise-shaper input and combines said non-linear value with an input of said quantizing, and wherein said quantizing quantizes said combination of said non-linear value with an input of said quantizing.

14. The method of claim 12, wherein said introducing a non-linearity is performed by said quantizing, wherein a quantization function of said quantizing has unequal steps for equal input steps.

15. The method of claim 12, wherein said non-linearity is a non-linear operation that alternates between two different functions, and wherein said alternation occurs with each repetition of said quantizing.

16. The method of claim 15, wherein said two different functions are a first function and a negation of said first function.

17. The method of claim 15, wherein the absolute value of said function during even pulses differs from the function for odd pulses.

18. The method of claim 12, wherein said non-linearity approximates a square of an input to said non-linear element.

19. A pulse generating circuit, comprising:
   means for noise-shaping a pulse generator input signal;
   a pulse generator including a consecutive-edge modulator for modulating both a rising edge and a falling edge of pulses generated at an output of said pulse generator in conformity with said pulse generator input signal; and
   means for altering a transfer function from said pulse generator input signal to an input of said pulse generator such that said pulse generator generates said pulses so that expected values of pulse widths of a predetermined state are substantially equal for both rising edge and falling edge portions of said pulses for DC values applied to said input of said delta-sigma modulator within an operating range of DC values.

20. The pulse generating circuit of claim 19, wherein said means for altering comprises a quantizer of said noise-shaping means and wherein a response of said quantizer is alternated at each sample output from said quantizer.

* * * * *